United States Patent [19]

Koogler

[11] 4,352,010
[45] Sep. 28, 1982

[54] VARIABLE RATE TUNING FOR RADIO TRANSMITTERS AND RECEIVERS

[75] Inventor: Steven C. Koogler, Dayton, Ohio

[73] Assignee: R. L. Drake Company, Miamisburg, Ohio

[21] Appl. No.: 121,086

[22] Filed: Feb. 13, 1980

[51] Int. Cl.³ .............................................. G06M 3/14
[52] U.S. Cl. ........................ 235/92 EV; 235/92 PL; 235/92 DE; 455/185
[58] Field of Search .......... 235/92 MP, 92 V, 92 EV, 235/92 DE, 92 PL, 92 FQ, 92 CV; 455/185; 328/44

[56] References Cited

U.S. PATENT DOCUMENTS

| | | | |
|---|---|---|---|
| 3,835,384 | 9/1974 | Liff | 325/25 |
| 3,843,873 | 10/1974 | Beville et al. | 235/92 EV |
| 3,878,488 | 4/1975 | Blythe et al. | 334/39 |
| 4,270,117 | 5/1981 | Ziegelbein et al. | 235/92 EV |

FOREIGN PATENT DOCUMENTS 2723299 11/1978 Fed. Rep. of Germany ...235/92 DE
1078221 8/1967 United Kingdom .

OTHER PUBLICATIONS

"Programmable Synthesized Receiver", Model RA 1792, Manufactured by Racal Communications, Ltd., Manufacturing Brochure 1979.

*Primary Examiner*—Joseph M. Thesz
*Attorney, Agent, or Firm*—Biebel, French & Nauman

[57] ABSTRACT

A variable rate tuning circuit of the type which may be used to control the frequency of transmitters, receivers, and transceivers includes a manually rotatable dial (15) connected to a pulse generator (20) the output of which produces pulses directly proportional to the amount of dial rotation. These pulses are applied directly to a frequency determining counter (10), and the pulse rate is such that fine resolution over the frequency of the device may be obtained directly from rotating the dial slowly. Large changes in frequency may be made by rotating the dial rapidly. The output pulses pass through a differentiator (40), and integrator (30) to a voltage-to-frequency converter (35). The faster the dial is rotated, the larger will be the analog voltage output of the integrator, thus the higher the output frequency of the converter (35). The output of the converter is also applied to the frequency determining counter (10). Therefore, the amount the counter is incremented or decremented with respect to the amount of dial rotation is a function of the speed at which the dial is rotated.

6 Claims, 4 Drawing Figures

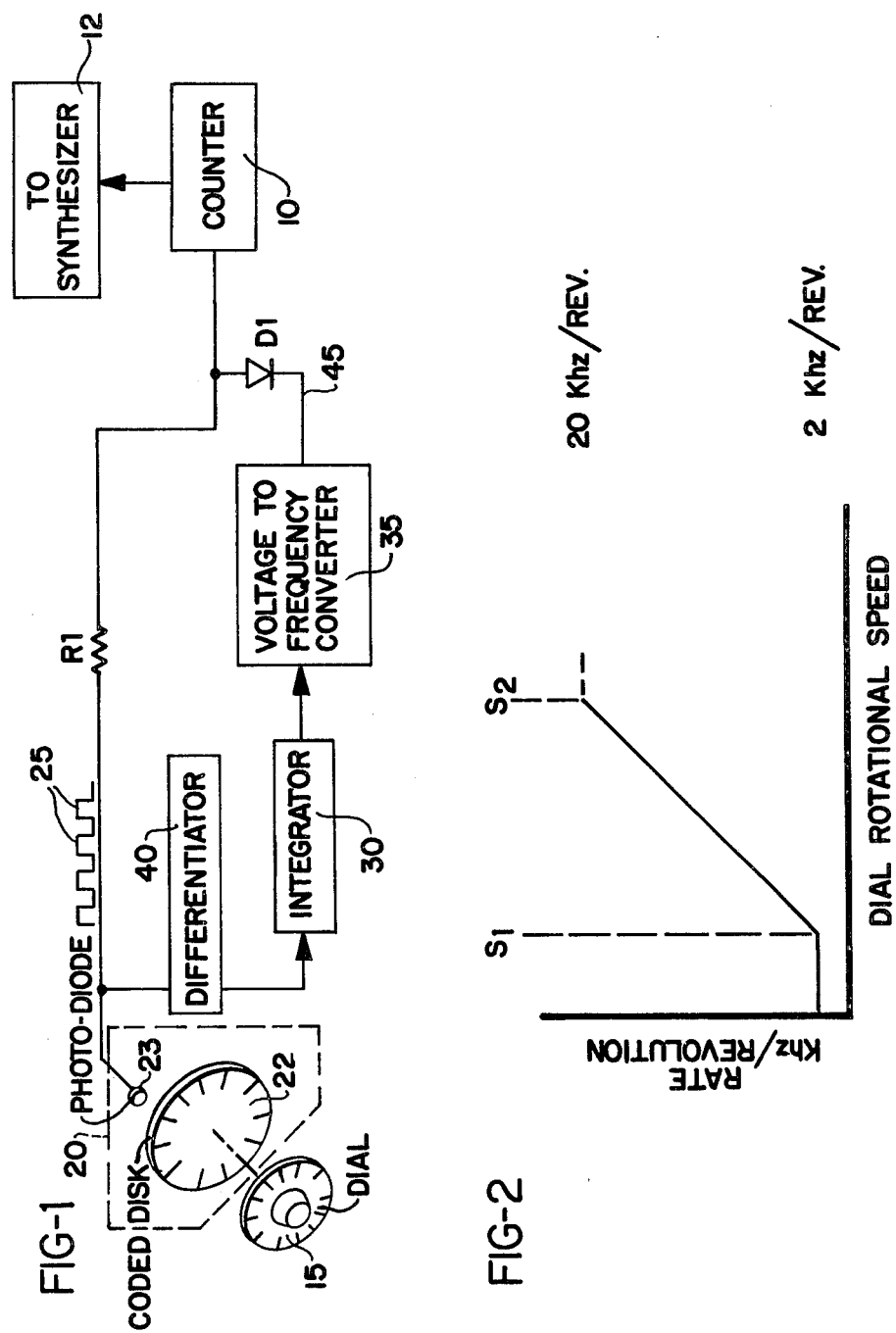

VARIABLE RATE TUNING FOR RADIO TRANSMITTERS AND RECEIVERS

BACKGROUND OF THE INVENTION

This invention relates to a tuning control for a radio frequency device such as a transmitter, receiver or transceiver, and particularly to a single knob tuning arrangement for providing both fine and coarse tuning. The rate at which the tuning knob is rotated determines the resolution or the rate at which the frequency is changed with respect to the amount of dial rotation.

Radio communications equipment of modern design used various means for controlling frequency. One common technique is to use crystals or frequency synthesizers to provide for coarse frequency determination, and to provide an operator controlled dial or knob for fine tuning. The knob may control a permeability tuned oscillator (PTO) or a frequency synthesizer.

In one modern receiver, the PTO is designed to cover a 500 kHz range of frequencies (from 5.05 to 5.55 mHz, for example). The rate at which this dial controls frequency is determined by the components within the PTO, and typically may vary in the range of from 15 to 30 kHz per dial revolution.

In another modern radio communications device, the dial is connected to an optically encoded disc, and pulses generated by phototransistors as the markings on the disc pass thereby are applied to the input of a counter which determines the frequency of the device. Switch means may be used to determine the resolution of the tuning dial, e.g., with the switch in one position, the dial resolution may be 10 Hz per revolution; in another position, 100 Hz per revolution; and in still another position, 1 kHz or 10 kHz, etc. In the above devices, the dial resolution must be switch selected by the operator.

In another tuning system, the speed at which the dial rotates control dial resolution. For example, in U.S. Pat. No. 3,835,384, the resolution may be 10 Hz, 100 Hz, or 1 kHz, all automatically selected according to the rate at which the dial is rotated. In this prior art device, as the speed of dial is increased, there will be a sudden change in dial resolution, making it difficult for the operator to control accurately the output frequency.

SUMMARY OF THE INVENTION

This invention relates to a tuning control for a radio frequency device which provides for fine resolution when an operator controlled dial is rotated slowly while permitting the operator to make large changes in frequency quickly and smoothly by rotating the dial quickly.

In the present invention, an operator controlled dial is associated with means for generating pulses as the dial is rotated. The pulse generator means may include an optically encoded disc and associated phototransistors, or some other readily available pulse generators, such as magnetic or Hall effect devices.

The output of the pulse generator is connected to a counter, and the output of the counter is connected to a frequency determining circuit. The counter is either incremented or decremented according to the direction of rotation of the dial and thus controls the frequency of the device.

In addition to applying pulses directly to a counter from the pulse generator, the pulse generator output is connected to means for providing additional pulses for incrementing or decrementing the counter, and the rate at which these additional pulses are added is a function of the speed at which the dial is rotated.

In a preferred embodiment, the pulse generator output is connected to an integrator, the output of which is an analog voltage proportional to the rate the dial generated pulses are generated. This analog voltage is connected to the base of field effect transistor (FET) which controls current to a timing capacitor in an oscillator circuit, thus forming a voltage-to-frequency converter. The output of this circuit is also connected to the input of the frequency determining counter.

It is preferable to provide a threshold circuit so that the oscillator will not add any pulses to the counter until the dial rotational speed has increased above some predetermined rate. Thus, for slow rotational speeds, only those pulses from the dial are applied to the counter, and as the rotational rate increases, the analog voltage will rise sufficiently to cause the oscillator to generate additional pulses which are added to the counter in a smooth and natural manner.

Since there are no step changes in the rate at which pulses are added to the counter, the frequency of the device can be easily and naturally controlled. The resolution can be as fine or as coarse as desired by the operator. In a practical embodiment of this invention, the dial resolution is made to vary continuously from 2 kHz per dial revolution up to over 20 kHz per dial revolution.

Accordingly, it is an object of this invention to provide an improved tuning control for a radio frequency device providing fine resolution when the dial is rotated slowly while permitting large frequency changes to be made quickly and smoothly by rotating the dial quickly.

It is another object of this invention to provide a variable rate tuning circuit of the type which includes a manually rotatable dial, means responsive to the rotation of the dial for producing pulses at a rate directly proportional to the amount of dial rotation, a frequency determining counter, means responsive to the dial produced pulses and the direction of rotation of the dial for incrementing or decrementing the counter, and further means responsive to the dial produced pulses for providing additional pulses for incrementing or decrementing the counter, the rate at which the additional pulses are produced being related to the rate at which the dial produced pulses are generated whereby the amount the counter is incremented or decremented with respect to the amount of dial rotation is a function of the speed at which the dial is rotated.

Other objects and advantages of the invention will be apparent from the following description, the accompanying drawings and the appended claims.

BRIEF DESCRIPTION OF THE DRAWINGS

FIG. 1 is a block diagram showing the basic elements comprising the invention.

FIG. 2 is a chart showing the relationship between the dial rotational speed and the rate at which pulses are applied to the counter per dial revolution.

DESCRIPTION OF THE PREFERRED EMBODIMENT

Figure 3A:
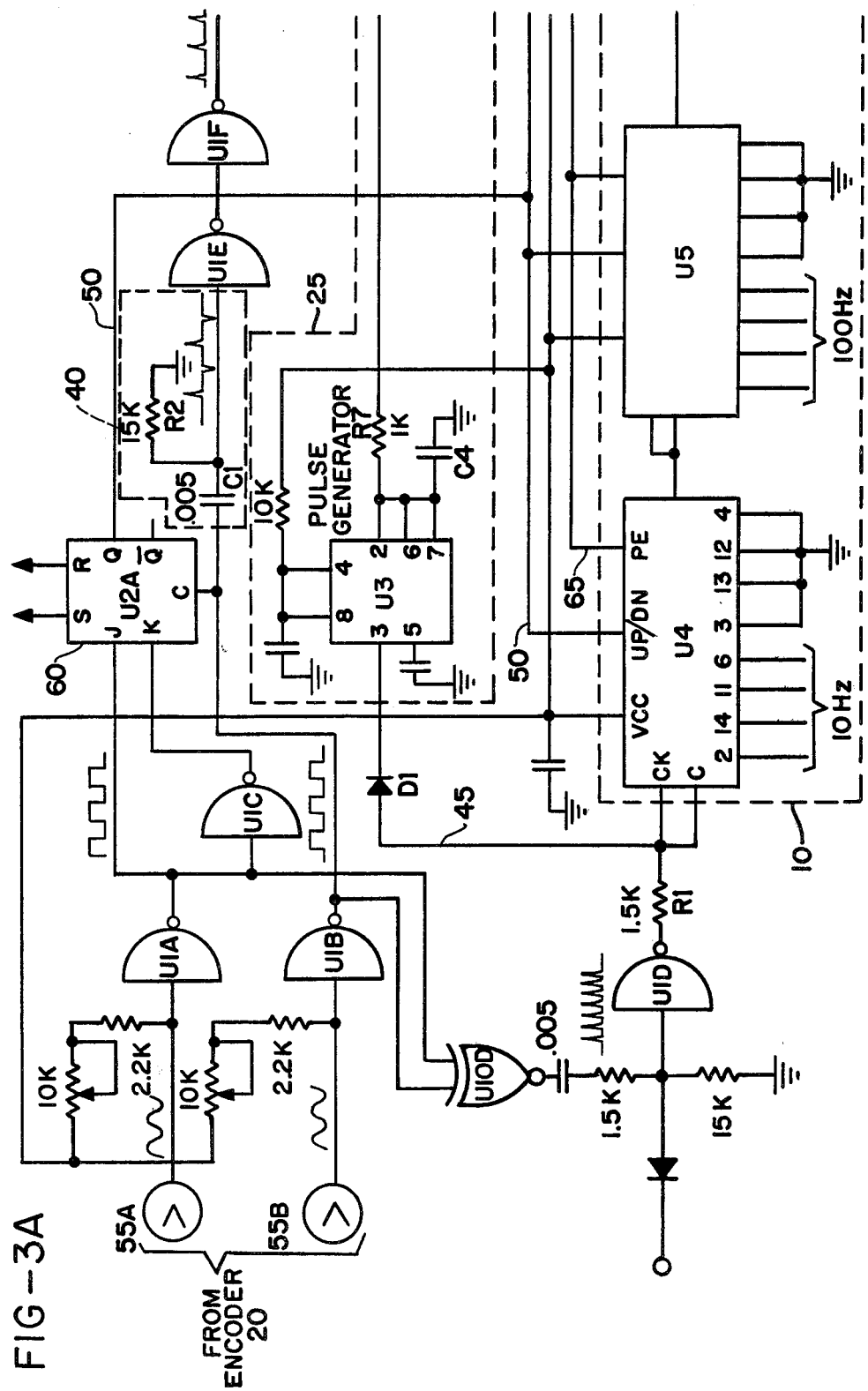
FIGS. 3a and 3b together comprise an electrical schematic diagram of a preferred embodiment of the invention.

Referring now to the drawings, and particularly to FIG. 1 which illustrates a simplified form a preferred embodiment of the invention, a counter 10 is used as a frequency determining device, and its output is connected to a frequency synthesizer 12 which in turn generates a radio frequency signal for use by the remainder of the equipment, such as a receiver, transceiver, or transmitter.

The counter 10 is usually preset upon initial turn on to the mid part of its tuning range, and thereafter it is incremented or decremented by pulses originating from a manually controlled dial 15.

Means 20 connected to the dial 15 convert its rotation into electrical pulses. For example, the dial may be connected to an optically encoded disc 22 having markings formed thereon which are sensed by a photodiode array 23 producing output pulses represented by the waveform 25. Actually, a plurality of photodiodes are used and the resulting output pulses also contain information regarding the direction of dial rotation so that the counter 10 is either incremented or decremented, and thus the frequency of the device either increased or decreased under the control of the operator.

The circuit also includes means responsive to the pulses 25 for providing additional pulses to the counter 10. The rate that these additional pulses are produced is related to the pulse rate of the pulses 25. This accomplished by applying the pulses 25 to an integrator circuit 30 the output of which is an analog voltage which is applied to a voltage-to-frequency converter 35. Thus, as the dial rotational speed increases, the voltage output of the integrator increases, and the output frequency of the converter 35 also increases. These additional pulses are also applied as an input to the counter 10.

Where the pulse generating means 20 produces square wave output pulses, a differentiator circuit 40 is included, the output of which converts the leading and trailing edges of the pulses 25 to short duration spikes, and these are applied to the integrator circuit 30.

Referring to FIG. 2, it may be seen that as the dial rotational speed increases from zero up to speed S1, only those pulses generated by the pulse generator 20 and applied directly to the counter 10 are effective in changing frequency. This provides, for example, a dial resolution of approximately 2 kHz per dial revolution. After the dial speed has increased above speed S1, the voltage output of the integrator 30 will be sufficient to cause additional output pulses from the voltage-to-frequency converter 35.

Therefore, as the dial rotational speed increases further it finally reaches a point at speed S2 where the maximum frequency output of the converter 35 is obtained. These additional pulses 45 are added to the pulses 25 and applied to the counter 10. At speed S2, the dial resolution may be for example 20 kHz per revolution. Of course, it is to be understood that the speeds S1 and S2 and the basic dial resolution of 2 kHz per revolution can all be varied, as well as the maximum pulse output from the converter 35.

As shown in FIG. 2, the speed S2 represents the highest practical speed at which the operator is expected to rotate the dial and also the maximum pulse output rate from converter 35.

Therefore, the amount of the counter 10, and thus the frequency of the device, is changed with respect to the amount of dial rotation will be function of the speed at which the dial is rotated. In other words, if the dial is rotated slowly, the resolution may be as fine as 2 kHz per revolution; while on the other hand, if the dial is rotated at a high rate of speed, the dial resolution may be as low or as coarse as 20 kHz per revolution. The change from fine to coarse resolution, however, in the present invention, is a smooth and substantially continuous change, one that is natural for the operator, and one which allows him to have complete control over the frequency of the device.

Figure 3B:
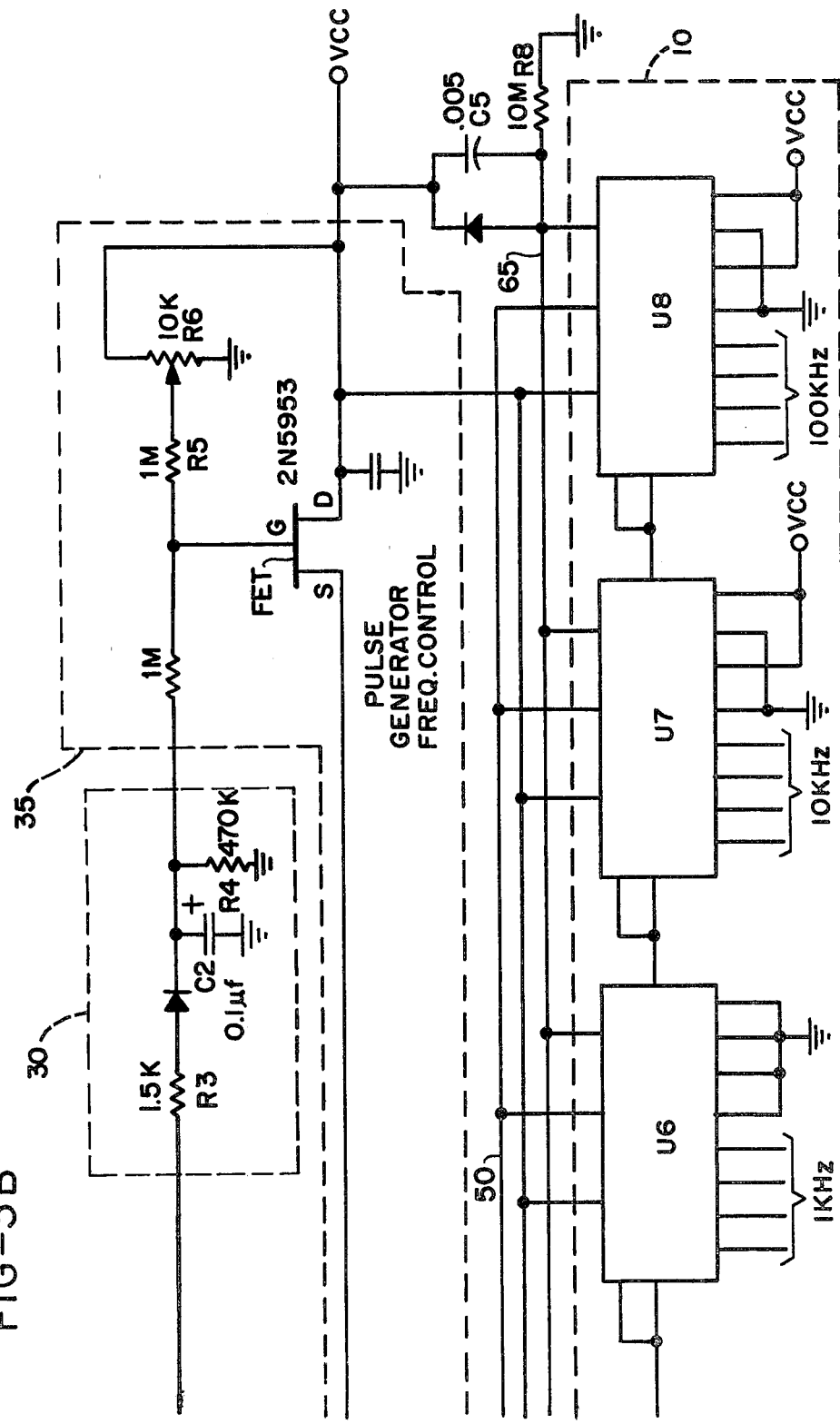

Referring now to the detailed schematic diagram of FIGS. 3a and 3b, it will be noted that the frequency determining counter 10 in the preferred embodiment of the invention comprises five integrated circuits U4–U8, each of which is a type 14510 counter. These counters may be counted up or down depending upon the voltage applied to the "up/dn" input on line 50. Counter U4 has four outputs (2, 6, 11, and 14) controlling 10 Hz resolution; the counter U5 output controls the 100 Hz resolution; counter U6, 1 kHz; counter U7, 10 kHz; and counter U8, 100 kHz. These frequency controlling outputs are applied to the frequency synthesizer 12, as previously explained.

The output pulses from the pulse generator 20 are applied to input terminals 55a and 55b, shown at the upper left of FIG. 3a. Normally, a pair of photodiodes are used, and their outputs are phase related so that the direction of rotation of the dial can be determined. These pulses pass through Schmitt triggers U1a and U1b which change the usual sinusoidal wave form into square wave pulses, as shown. These pulses are applied to a circuit shown generally at 60 which includes a J-K flip flop U2a, which determines the direction of rotation. The Q output of U2a is connected to line 50, and thus controls whether the counters of circuit 10 count up or down as pulses are applied thereto.

The outputs of the Schmitt triggers U1a and U1b are also applied to an Exclusive OR circuit U10d, the output of which is a series of pulses at twice the rate of the pulse output from either of the Schmitt triggers. These pulses pass through an inverter and buffer U1d to the input of counter U4 in the counter circuit 10. Thus, dial generated pulses are processed by the Schmitt triggers U1a and U1b, the Exclusive OR U10d and the buffer U1d and are applied directly to the counter 10, while the direction of rotation is sensed by the circuit 60 to cause the counter 10 to either increment or decrement is determined by the direction of dial rotation.

The output pulses from one of the Schmitt triggers, U1b and the present embodiment, is also applied to the differentiator circuit 40 including capacitor C1 and resistor R2. Since the output from the encoder is a sine wave which is converted into a square wave by the Schmitt trigger U1b, the output pulse has an average energy level which does not vary substantially with changes in the dial rotational speed. Accordingly, the differentiator circuit 40 converts the square wave output into a series of spikes or short duration pulses, and these pass through inverters U1e and U1f to the integrator circuit 30, including capacitor C2 and resistors R3 and R4.

The output of the integrator 30 is an analog voltage which is a function of the rate at which pulses are applied thereto, or in other words, it is a voltage related to the rate at which dial generated pulses are produced. This analog voltage is applied to the voltage-to-frequency converter 35.

The voltage-to-frequency converter 35 includes a field effect transistor (FET) (type 2N5953) having its gate electrode connected to the integrator 30 and also through resistor R5 to a threshold setting potentiometer R6. The field effect transistor has its source electrode connected through resistor R7 to a timing capacitor C4 associated with an oscillator U3 (type NE555/MC1455 timing device).

The FET controls the charging rate of capacitor C4 in response to the voltage applied to its gate electrode. The oscillator U3 will provide an output pulse whenever the voltage in capacitor C4 changes to approximately ⅔ of VCC at which time the capacitor will be discharged to a voltage of ⅓ VCC. The capacitor C4 will alternate between these two voltages, and the rate at which it does so is dependent on the current passing through the FET. Thus, the higher the voltage on the gate of the FET, the higher the current flow therethrough and the higher will be the pulse output from the oscillator U3.

The oscillator U3 has its output on line 45 connected through diode D1 to the input of first stage counter U4 of the frequency determining counter 10.

Counters U4–U8 within the counter 10 are preset to the mid part of the tuning range by the voltages applied to pins 3, 4, 12, and 13 at initial power turn-on by means of a control voltage on line 65 generated by capacitor C5 and resistor R8. This control voltage is a one time pulse applied to pins PE on each of the counters.

While the form of apparatus herein described constitute preferred embodiment of this invention, it is to be understood that the invention is not limited to this precise form of apparatus, and that changes may be made therein without departing from the scope of the invention which is defined in the appended claims.

What is claimed is:

1. A variable rate tuning circuit including
a manually rotatable dial,
means responsive to the rotation of the dial for producing first pulses directly proportional to the amount of dial rotation,
a frequency determining counter,
means responsive to said first pulses and the direction of dial rotation for incrementing and decrementing said counter, and
further means responsive to said first pulses for providing additional pulses for incrementing and decrementing said counter, the rate said additional pulses are produced being related to the rate said first pulses are produced,
whereby the amount said counter is incremented or decremented with respect to the amount of dial rotation is a function of the speed at which said dial is rotated.

2. In a radio frequency device having a digitally controlled frequency determining circuit, and a manually rotatable dial means for generating pulses to increment and decrement said frequency determining circuit,
the improvement comprising,
means responsive to said dial generated pulses for generating additional pulses at a rate determined by the speed said dial is rotated, said means including,
means for converting the frequency of said dial generated pulses into an analog voltage, and
a voltage-to-frequency converter means responsive to said analog voltage for providing output pulses, the frequency of which is related to the speed said dial is rotated, said output pulses being added to the pulses from said manually rotatable dial means.

3. In a radio frequency device having a digitally controlled frequency determining circuit, and a manually rotatable dial means for generating pulses for incrementing and decrementing said frequency determining circuit,
the improvement comprising,
means responsive to the rate at which said dial generated output pulses are generated for producing an output signal the magnitude of which is a function of said rate, and
means responsive to said output signal for generating additional pulses which are applied to said frequency determining circuit, the rate said additional pulses are generated being a function of the speed at which said dial is rotated.

4. In a radio frequency device including an operator manipulated dial and means associated therewith for producing electrical output pulses in response to the amount of dial rotation, and frequency determining means having an input responsive to said dial generated output pulses,
the improvement comprising,
means responsive to said dial generated output pulses for producing an analog voltage proportional to the rate at which said output pulses are generated, and
voltage-to-frequency converter means responsive to the analog voltage for providing additional pulses to the input of said frequency determining means according to the speed at which said dial is rotated.

5. The circuit of claim 4 wherein said analog voltage producing means includes,
an integrator having an output voltage proportional to the rate at which said dial generated output pulses are generated,
and wherein said voltage-to-frequency converter includes a voltage dependent oscillator, the output frequency of which is a function of the voltage applied thereto.

6. The device of claim 4 wherein said analog voltage producing means includes,
differentiator means responsive to said dial generated output pulses,
an integrator connected to the output of said differentiator means,
and wherein said voltage-to-frequency converter includes,
an FET having its gate electrode connected to the output of said integrator,
a capacitor for controlling the frequency of voltage to frequency converter circuit having an input connected to the source electrode of said FET,
wherein the higher the analog voltage, the higher the current flow to said capacitor and thus the higher the output frequency of voltage-to-frequency converter circuit.

* * * * *